United States Patent
Julson et al.

(10) Patent No.: US 9,081,039 B2
(45) Date of Patent: Jul. 14, 2015

(54) VEHICLE ELECTRICAL SYSTEM FAULT DETECTION

(75) Inventors: Timothy D. Julson, Rochester Hills, MI (US); Nathan P. Makarewicz, Oxford, MI (US); Gary W. Taraski, Oxford, MI (US); Paul Capalau, Whitby, CA (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 115 days.

(21) Appl. No.: 13/473,950

(22) Filed: May 17, 2012

(65) Prior Publication Data

US 2013/0308237 A1    Nov. 21, 2013

(51) Int. Cl.
| | |
|---|---|
| H02H 3/08 | (2006.01) |
| H02H 9/02 | (2006.01) |
| G01R 19/165 | (2006.01) |
| G01R 31/00 | (2006.01) |
| H02H 3/22 | (2006.01) |
| G01R 31/28 | (2006.01) |

(52) U.S. Cl.
CPC ........ *G01R 19/16571* (2013.01); *G01R 31/007* (2013.01); *G01R 31/2837* (2013.01)

(58) Field of Classification Search
USPC ....................................................... 361/93.1
See application file for complete search history.

(56) References Cited

U.S. PATENT DOCUMENTS

| | | | | |
|---|---|---|---|---|
| 5,804,944 | A | * | 9/1998 | Alberkrack et al. .......... 320/163 |
| 6,034,581 | A | * | 3/2000 | DiMarco et al. ................ 335/16 |
| 6,037,676 | A | * | 3/2000 | Foree .......................... 307/10.7 |
| 6,404,163 | B1 | | 6/2002 | Kapsokavathis et al. |
| 6,809,501 | B2 | | 10/2004 | Kapsokavathis et al. |
| 7,009,365 | B1 | | 3/2006 | Namuduri et al. |
| 7,122,993 | B2 | | 10/2006 | Bauerle et al. |
| 7,460,344 | B2 | * | 12/2008 | Hastings et al. ................ 361/42 |
| 8,526,145 | B2 | * | 9/2013 | Fanzutti et al. ................. 361/42 |
| 2005/0219779 | A1 | * | 10/2005 | Kim ................................ 361/56 |
| 2010/0213948 | A1 | | 8/2010 | Bauer et al. |
| 2011/0246205 | A1 | * | 10/2011 | Lin et al. ....................... 704/500 |

FOREIGN PATENT DOCUMENTS

| | | |
|---|---|---|
| CN | 1087585 C | 7/2002 |
| CN | 101718842 A | 6/2010 |
| WO | 9603018 A1 | 2/1996 |

OTHER PUBLICATIONS

KR-2012-0033191, Transient current monitoring device and method for dc voltage source system; Abstract, specification, drawings.*
KR-101145497, KR20120033191; Transient current monitoring device and method for DC voltage source system; abstract, specification.*
State Intellectual Property Office of the People's Republic of China, Office Action in Chinese Patent Application No. 201310181093.8 mailed May 6, 2015.

* cited by examiner

*Primary Examiner* — Dharti Patel
(74) *Attorney, Agent, or Firm* — Ingrassia Fisher & Lorenz, P.C.

(57) ABSTRACT

Methods and systems are provided for sensing electrical faults. The system includes a current sensor disposed between a battery and at least one electrical load. The current sensor is capable of sensing electrical current flowing from the battery to the load at a sensitivity sufficient to detect a current transient. The system also includes a controller in communication with the current sensor. The controller is capable of comparing the sensed current transient to a predetermined current transient for the load and signaling a fault when the sensed current transient and the predetermined current transient vary by a predetermined amount.

15 Claims, 3 Drawing Sheets

VEHICLE ELECTRICAL SYSTEM FAULT DETECTION

TECHNICAL FIELD

The technical field generally relates to a system and method for detecting electrical faults and more particularly relates to a system and method for detecting electrical faults in a vehicle.

BACKGROUND

Current electrical fault detection techniques for motor vehicles are typically rudimentary. For instance, during assembly or maintenance of a vehicle, a technician may simply activate electrical loads, such as headlamps, turn signals, a motor starter, etc., and visually verify that they operate. Unfortunately, such basic testing does little to reveal future problems, such as loose electrical connectors, strained electrical wiring, or loads that are nearing the end of their life.

Accordingly, it is desirable to provide systems and methods for determining hidden electrical problems in vehicle prior to the load simply not responding. Furthermore, other desirable features and characteristics of the present invention will become apparent from the subsequent detailed description and the appended claims, taken in conjunction with the accompanying drawings and the foregoing technical field and background.

SUMMARY

A system is provided for detecting electrical faults. In one embodiment, the system includes a current sensor disposed between a battery and at least one electrical load. The current sensor is capable of sensing electrical current flowing from the battery to the load at a sensitivity sufficient to detect a current transient. The system also includes a controller in communication with the current sensor. The controller is capable of comparing the sensed current transient to a predetermined current transient for the load and signaling a fault when the sensed current transient and the predetermined current transient vary by a predetermined amount.

A method is provided for detecting electrical faults. In one embodiment, the method includes activating a load. An electrical current is sensed flowing from a battery to the load at sensitivity sufficient to detect a current transient. The method further includes comparing the sensed current transient to a predetermined current transient for the load. The method also includes signaling a fault when the sensed current transient and the predetermined current transient vary by a predetermined amount.

DESCRIPTION OF THE DRAWINGS

The exemplary embodiments will hereinafter be described in conjunction with the following drawing figures, wherein like numerals denote like elements, and wherein.

DETAILED DESCRIPTION

The following detailed description is merely exemplary in nature and is not intended to limit the application and uses. Furthermore, there is no intention to be bound by any expressed or implied theory presented in the preceding technical field, background, brief summary or the following detailed description.

Figure 1:
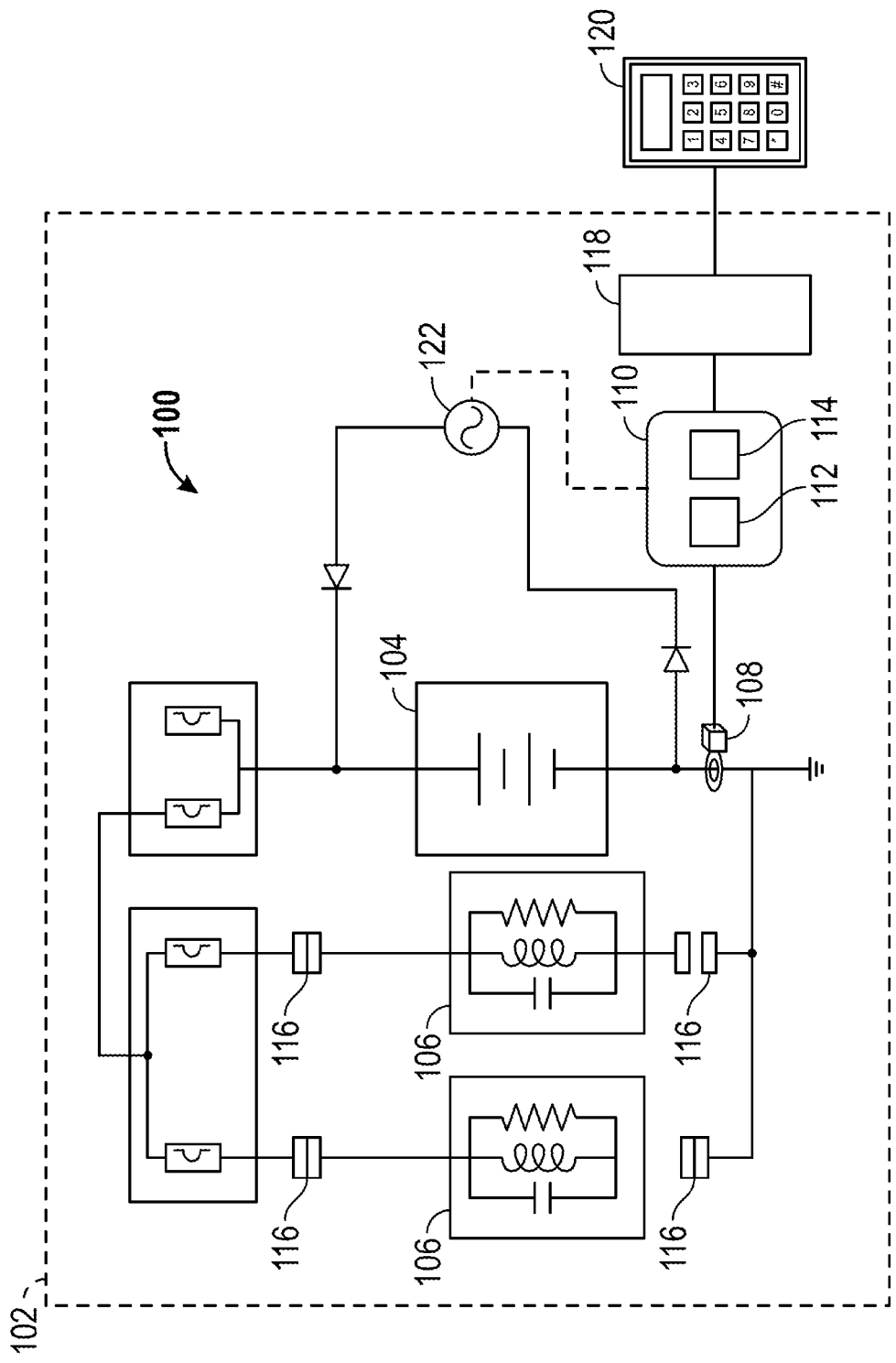
FIG. 1 is block schematic diagram of an electrical fault detection system in accordance with an embodiment.

Referring to FIG. 1, an electrical fault detection system 100 is shown and/or described herein. The system 100 of the illustrated embodiment is described for use in a vehicle 102. Specifically, the system 100 of the illustrated embodiment may be used in an automobile (not separately numbered). However, those skilled in the art appreciate that the system 100 may be used with other types of vehicles 100 or non-vehicle applications.

The vehicle 102 includes a battery 104 for supplying electrical energy. As is well known by those skilled in the art, the battery 104 may include one or more electrochemical cells (not shown) that convert stored chemical energy into electrical energy. In the illustrated embodiment, the battery 104 is rechargeable, i.e., a secondary battery. However, in other embodiments, the battery 104 may be a primary battery.

The vehicle 102 further includes at least one electrical load 106 electrically connectable to the battery 104 for using the electrical energy supplied by the battery 104. In the illustrated embodiment, a plurality of loads 106 is shown. These loads 106 may include, but are certainly not limited to, a light, an electric starter, a radio, a sensor, and a display. However, those skilled in the art realize the vast variety of electrical loads 106 that may be implemented in the vehicle 102 or other loads 106 for non-vehicle applications. Furthermore, although multiple loads 106 may be utilized in the vehicle 102 and the system 100 described herein, the at least one electrical load 106 may be referred to simply as "the load 106" for ease of readability.

The system 100 includes a current sensor 108 disposed between the battery 104 and the load 106. The current sensor 108 senses electrical current flowing from the battery 104 to the load 106. Specifically, the current sensor 108 senses electrical current to the load 106 at a sensitivity sufficient to detect a current transient. That is, the current sensor 108 is sensitive enough to detect the "inrush current" or "surge current" that occurs when the load 106 is activated.

The system 100 further includes a controller 110. The controller 110 may comprise a microprocessor, a microcontroller, an application specific integrated circuit ("ASIC"), a digital signal processor ("DSP"), or any other suitable digital computational device. The controller 110 is in communication with the current sensor 108. That is, the controller 110 is electrically connected to the current sensor 108 such that readings from the current sensor 108 may be received and processed by the controller 110. More specifically, the controller 110 may include an analog-to-digital converter ("ADC") 112 for converting an analog signal from the current sensor 108 to a digital signal, as well appreciated by those skilled in the art. The controller 110 may be a stand-alone device, or may be integrated with other suitable device, e.g., a multi-function microprocessor used to control numerous aspects of the vehicle 102.

As with the current sensor 108, the controller 110 also has a sensitivity sufficient to detect a current transient. For instance, a sample rate of the ADC 112 must be sufficient to detect the spike in current that occurs over a very short period of time. In one embodiment, the sample rate is at least 750 kHz. That is, the ADC 112 produces at least 750,000 samples per second from the signal provided by the current sensor 108. In another embodiment, the sample rate is at least 1 MHz, or 1,000,000 samples per second. In yet another embodiment, the sample rate is between 3 and 5 MHz. Of course, the higher the sample rate, the more sensitive the controller 110 is to detecting current transients. However, the ADC 112 need only have a sample rate sufficient to detect the current transient.

In the illustrated embodiment, the current sensor 108 and the controller 110 are sufficiently sensitive to detect a 0.01 ampere ("A") change in current. More specifically, the current sensor and the controller 110 of the illustrated embodiment are sufficiently sensitive to detect a one milliampere ("mA") change in current.

The controller 110 also includes a memory 114 for storing data. Those skilled in the art will realize a wide variety of suitable techniques and/or devices for implementing the memory 114, including, but certainly not limited to, random access memory ("RAM"), read-only memory ("ROM"), optical storage devices (e.g., compact discs), flash memory, and magnetic discs (e.g., hard drives, floppy discs).

At least part of the memory 114 stores at least one predetermined current transient for each load 106. For example, one predetermined current transient for a specific load 106 is data corresponding to an ideal current transient, (i.e., a "gold standard" current transient) for when that load 106 is activated. Other current transients for the load 106 may be data corresponding to a variety of non-ideal current transients for the load 106. For instance, one predetermined current transient for the load 106 may be data corresponding to a situation where a wire (not numbered) leading to the load has become loose, but not disconnected from a connector (not shown). Another predetermined current transient for the load may be data corresponding to a situation where the impedance of the load has increased.

The controller 110 is capable of comparing the sensed current transient to the ideal current transient for the load. By performing this comparison, the controller 110 can determine whether or not the sensed current transient is ideal or if a non-ideal (i.e., abnormal) condition occurs. The controller 110 is also capable of signaling a fault when the sensed current transient and the predetermined current transient vary by a predetermined amount. That is, the controller 110 may signal a fault if the predetermined current transient is non-ideal. Moreover, the controller 110 of the illustrated embodiment is capable of comparing the sensed current transient to other predetermined current transient, such that the exact reasons for the fault may be deduced, or at least estimated.

The system 100 may include one or more disconnect switches 116 electrically connected between the battery 104 and the load 106. The disconnect switches 116 may be configured to allow manual and/or automatic activation and deactivation of the load 106. For automatic control, at least one of the disconnect switches 116 may be in communication with the controller 110 such that the controller 110 can close or open switch 116.

The controller 110 may deactivate the load 106 in response to a fault being detected. For example, if the controller 110 determines that the sensed current transient is not ideal, the controller 110 may deactivate the load 106 by opening the switch 116 associated with the load 106.

Figure 2:
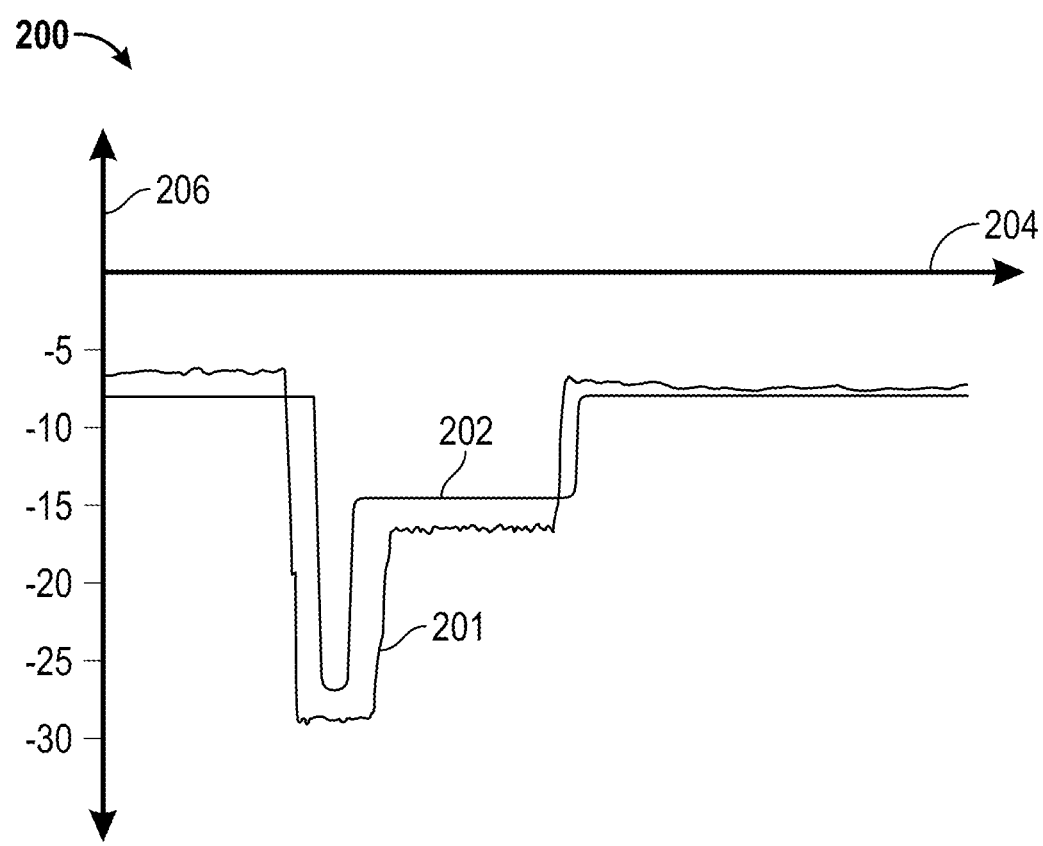
FIG. 2 is a graph showing a sensed current transient for a load and a predetermined current transient of the load in accordance with an embodiment.

With continuing reference to FIG. 1, FIG. 2 shows a graph 200 comparing the sensed current transient 201 to the ideal current transient 202 during the activation and deactivation of the load 106. The horizontal axis 204 represents time and the vertical axis 206 represents current draw from the battery 104. As can be seen, in the illustrated graph 200, the time of sensed current transient 201 is longer than the time of the ideal current transient 202 and the amount of current draw of sensed current transient 201 is greater than the ideal current transient 202. This may represent a fault in the load 106 that is being measured or the wiring to the load 106. As such, a fault would be signaled by the controller 110. Potentially, the load 106 may be disabled to prevent damage to the load 106. Of course, the comparison in FIG. 2 is only exemplary, and that other sensed and ideal current transient comparisons may appear different when represented graphically.

The system 100 of the illustrated embodiment further includes a connector 118 electrically connected to the controller 110. The connector 118 allows a remote control unit 120 to be electrically connected to the controller 110. The remote control unit 120 allows a user to interface with the controller 110. Specifically, in the illustrated embodiment, the user may operate the remote control unit 120 to begin testing one or more of the loads 106. During this testing process, the remote control unit 120 may direct a user to manually activate and/or deactivate the load 106. Once activated, the controller 110 receives the signal from the sensor 108 and determined whether or not to signal a fault, as described above.

The remote control unit 120 may be portable and disconnectable from the connector 118 (and thus disconnectable from the controller 110). However, in other embodiments, the remote control unit 120 may be permanently integrated into an electronic display (not shown) or other such control panel (not shown) of the vehicle 102.

The system 100, particularly when implemented in the vehicle 102, may include an alternator 122 for charging the battery 104. The alternator may be selectively connected to a motor (not shown) of the vehicle 102. Operation of the alternator 122 may be controlled by the controller 110. The controller 110 may control the alternator 122 to selectively charge the battery based, at least in part, on the current sensed by the current sensor 108. As such, the alternator 122 may be turned off to improve fuel economy of the vehicle 102.

Figure 3:
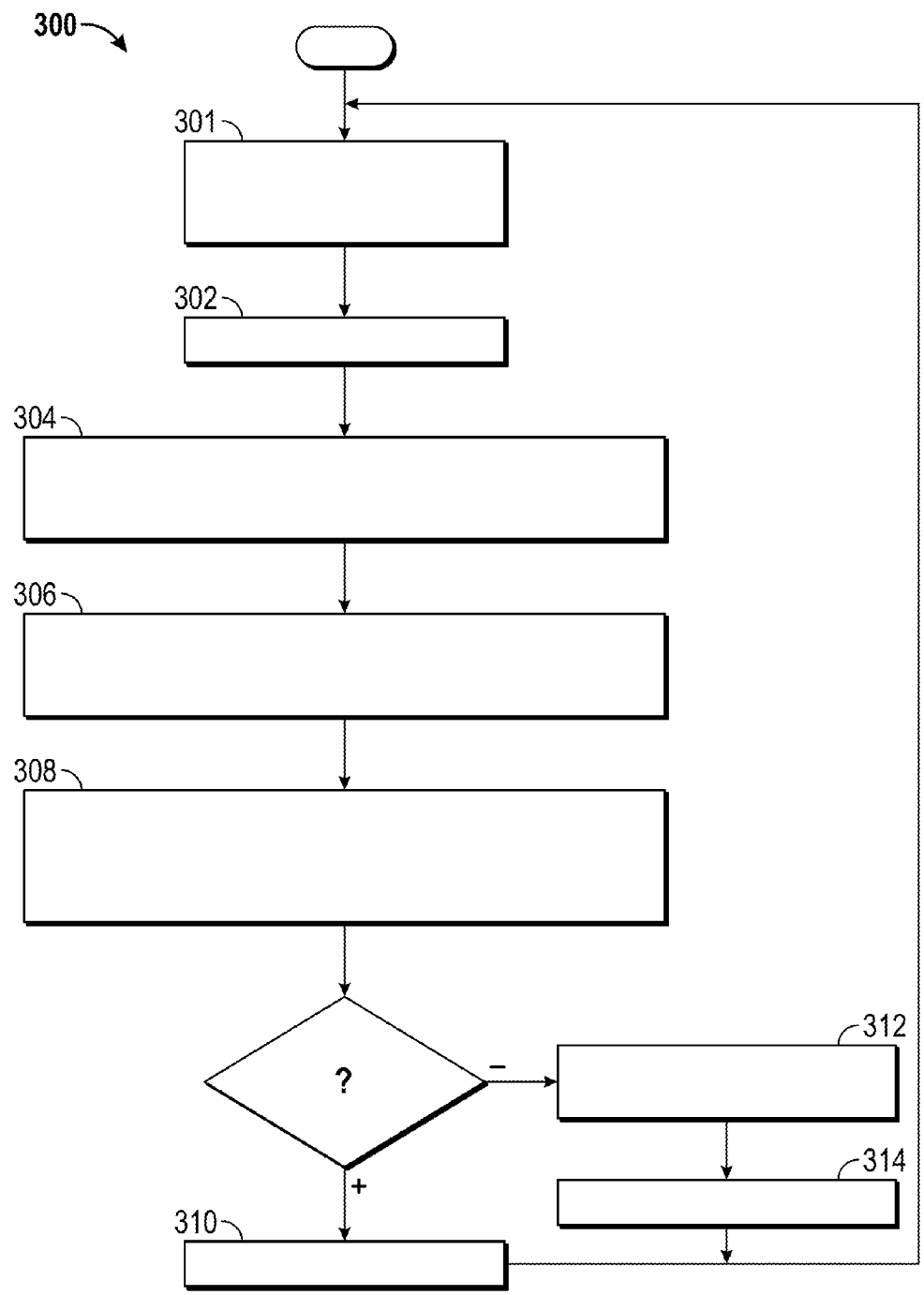
FIG. 3 is a flowchart showing a method of detecting electrical faults in accordance with an embodiment.

A method 300 of detecting electrical faults has been described above with relation to the described system 100. However, the method 300 may be implemented in other systems not specifically described herein. The method 300, as shown in FIG. 3, may include the step 301 of directing a user to manually activate one of a plurality of loads. The method 300 includes the step 302 of activating a load. Once the load is activated, the method 300 continues with the step 304 of sensing electrical current flowing from a battery to the load at sensitivity sufficient to detect a current transient. The method 300 further includes the step 306 of comparing the sensed current transient to a predetermined current transient for the load. The method 300 may also include the step 308 of signaling a fault when the sensed current transient and the predetermined current transient vary by a predetermined amount. Furthermore, the method 300 may include the step 310 of disabling the load in response to the signaling of the fault. If no fault is detected the method 300 may include the step 312 of directing the user to disconnect the load and the step 314 of disconnecting the load.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing the exemplary embodiment or exemplary embodiments. It should be understood that various changes can be made in the function and arrangement of elements without departing from the scope of the disclosure as set forth in the appended claims and the legal equivalents thereof.

What is claimed is:

1. A method for detecting electrical faults, comprising:
activating a load;
sensing electrical current flowing from a battery to the load at sensitivity sufficient to detect a current transient;
comparing the sensed current transient to a predetermined current transient for the load; and
signaling a fault when the sensed current transient and the predetermined current transient vary by a predetermined amount.

2. A method as set forth in claim 1 further comprising disabling the load in response to the signaling of the fault.

3. A method as set forth in claim 1 wherein the sensitivity is sufficient to detect a 0.01 ampere (A) change in current.

4. A method as set forth in claim 1 wherein the sensitivity is sufficient to detect a one milliampere (mA) change in current.

5. A method as set forth in claim 1 further comprising directing a user to manually activate the load.

6. A method as set forth in claim 5 further comprising directing the user to manually deactivate the load after the electrical current flowing from the battery to the load has been sensed.

7. An electrical fault detection system, comprising:
a current sensor configured to be disposed between a battery and at least one electrical load and further configured to sense electrical current flowing from the battery to the load at a sensitivity sufficient to detect a current transient; and
a controller in communication with said current sensor for comparing the sensed current transient to a predetermined current transient for the load and signaling a fault when the sensed current transient and the predetermined current transient vary by a predetermined amount.

8. A system as set forth in claim 7, further comprising a connector electrically connected to said controller for allowing a remote control unit to be electrically connected to said controller, the remote control unit capable of directing a user to manually activate and/or deactivate the load.

9. A system as set forth in claim 7 wherein the sensitivity is sufficient to detect a 0.01 ampere (A) change in current.

10. A system as set forth in claim 7 wherein the sensitivity is sufficient to detect a one milliampere (mA) change in current.

11. A vehicle, comprising:
at least one electrical load;
a battery electrically connected to the at least one electrical load for supplying electrical power to the at least one electrical load;
a current sensor disposed between said battery and said at least one electrical load for sensing electrical current flowing from said battery to said at least one electrical load at a sample rate sufficient to detect a current transient;
a controller in communication with said current sensor for comparing the sensed current transient to a predetermined current transient for said at least one electrical load and producing a fault signal when the sensed current transient and the predetermined current transient vary by a predetermined amount.

12. A vehicle as set forth in claim 11, further comprising a connector electrically connected to said controller for allowing a remote control unit to be electrically connected to said controller, the remote control unit capable of directing a user to manually activate and/or deactivate said at least one electrical load.

13. A vehicle as set forth in claim 11, further comprising a generator electrically connected to said battery for charging said battery.

14. A vehicle as set forth in claim 11 wherein the sensitivity is sufficient to detect a 0.01 ampere (A) change in current.

15. A vehicle as set forth in claim 11 wherein the sensitivity is sufficient to detect a one milliampere (mA) change in current.

* * * * *